(12) United States Patent
Song et al.

(10) Patent No.: US 9,786,862 B2
(45) Date of Patent: Oct. 10, 2017

(54) ORGANIC LIGHT EMITTING DEVICE INCLUDING A MULTI-LAYER LIGHT EMITTING STRUCTURE AND AN ORGANIC LIGHT EMITTING DISPLAY INCLUDING THE ORGANIC LIGHT EMITTING DEVICE

(71) Applicant: LG Display Co., Ltd., Seoul (KR)

(72) Inventors: Jae-Il Song, Paju-si (KR); Seung-Ryong Joung, Gwangmyeong-si (KR); So-Yeon Ahn, Seoul (KR)

(73) Assignee: LG DISPLAY., LTD., Seoul (KR)

( * ) Notice: Subject to any disclaimer, the term of this patent is extended or adjusted under 35 U.S.C. 154(b) by 0 days.

(21) Appl. No.: 14/466,686

(22) Filed: Aug. 22, 2014

(65) Prior Publication Data

US 2015/0097167 A1    Apr. 9, 2015

(30) Foreign Application Priority Data

Oct. 4, 2013  (KR) ........................ 10-2013-0118724

(51) Int. Cl.
*H01L 29/08* (2006.01)
*H01L 51/50* (2006.01)

(52) U.S. Cl.
CPC ............................... *H01L 51/5044* (2013.01)

(58) Field of Classification Search
None
See application file for complete search history.

(56) References Cited

U.S. PATENT DOCUMENTS

| | | | | |
|---|---|---|---|---|
| 2004/0027059 | A1* | 2/2004 | Tsutsui | H01L 51/5012 313/504 |
| 2011/0082296 | A1* | 4/2011 | Inoue | C07F 15/0033 544/225 |
| 2012/0074390 | A1* | 3/2012 | Seo | C07D 405/04 257/40 |
| 2013/0265320 | A1* | 10/2013 | Yamazaki | G09G 5/02 345/589 |
| 2014/0084273 | A1* | 3/2014 | Nakayama | H01L 51/0071 257/40 |

FOREIGN PATENT DOCUMENTS

| | | |
|---|---|---|
| CN | 1790768 A | 6/2006 |
| CN | 102157694 A | 8/2011 |
| EP | 1670083 A2 | 6/2006 |
| KR | 10-2013-0074654 A | 7/2013 |

* cited by examiner

*Primary Examiner* — Cory Eskridge
(74) *Attorney, Agent, or Firm* — Dentons US LLP

(57) ABSTRACT

An organic light emitting device including a first electrode connected to a thin film transistor formed on a substrate, a second electrode opposite to the first electrode, and an organic laminate formed between the first electrode and the second electrode and including a hole transport layer, a multilayer-light emitting structure, and an electron transport layer. The multilayer-light emitting structure includes at least two light emitting layers emitting light of different colors through recombination of electrons and holes injected through the first and second electrodes, and a charge transport control layer formed of a bipolar material transporting both electrons and holes at boundaries between the at least two light emitting layers and controlling the amount of charges transported between the at least two light emitting layers.

8 Claims, 4 Drawing Sheets

ORGANIC LIGHT EMITTING DEVICE INCLUDING A MULTI-LAYER LIGHT EMITTING STRUCTURE AND AN ORGANIC LIGHT EMITTING DISPLAY INCLUDING THE ORGANIC LIGHT EMITTING DEVICE

This application claims the benefit of Korean Patent Application No. 10-2013-0118724, filed on Oct. 4, 2013, which is hereby incorporated by reference for all purposes as if fully set forth herein.

BACKGROUND OF THE INVENTION

Field of the Invention

The present invention relates to an organic light emitting device which may improve efficiency and an organic light emitting display having the same.

Discussion of the Related Art

As the information age has arrived, the field of displays visually expressing electrical information signals has rapidly developed. Thus, various flat display devices to enhance performance, such as reduced thickness, light weight and low power consumption, have been researched.

As representative examples of flat display devices, there are liquid crystal displays (LCDs), plasma display panels (PDPs), field emission displays (FEDs), electro luminescent displays (ELDs), electro-wetting displays (EWDs), and organic light emitting displays (OLEDs), etc.

Thereamong, the OLED is a display device that displays an image using organic light emitting devices which emit light by themselves.

The organic light emitting device includes first and second electrodes opposite to each other and an organic laminate formed between the first and second electrodes. And, the organic light emitting device emits light based on driving current flowing between the first and second electrodes. The organic laminate includes a light emitting layer generating light through recombination of holes and electrons. And, the organic laminate emits light of different colors according to materials of a dopant included in the light emitting layer.

As one method to improve efficiency of the organic light emitting device or to produce white light, a multi-stack structure has been proposed. The multi-stack structure means a structure in which the organic laminate formed between the first and second electrodes includes a plurality of stacks. Here, each stack includes an electron transport layer, a light emitting layer, and a hole transport layer.

FIG. 1 is a cross-sectional view illustrating a general organic light emitting device having a multi-stack structure.

As exemplarily shown in FIG. 1, a general organic light emitting device 10 having a multi-stack structure includes an anode 11 and a cathode 12 opposite to each other, a plurality of stacks 13 and 14 formed between the anode 11 and the cathode 12, a charge generation layer 15 formed between the stacks 13 and 14, a hole injection layer 16 formed between the anode 11 and the plurality of stacks 13 and 14, and an electron injection layer 17 formed between the cathode 12 and the plurality of stacks 13 and 14.

Each of the stacks 13 and 14 includes a hole transport layer (HTL), a light emitting layer (EML), and an electron transport layer (ETL).

The charge generation layer 15 is formed in a multi-layered structure including at least two metals, oxides, and organic matters so as to generate holes and electrons which will be transported to the plurality of stacks 13 and 14.

That is, the charge generation layer 15 serves as a cathode injecting electrons into the stack 13 which is closer to the anode 11 then the other stack 14. Also, the charge generation layer 15 serves as an anode injecting holes into the stack 14 which is closer to the cathode 12 then other stack 13.

The organic light emitting device 10 having a multi-stack structure includes a large number of light emitting layers and may thus has an advantage of increasing efficiency, as compared to an organic light emitting device having a mono structure including one stack. However, the organic light emitting device 10 having a multi-stack structure includes a large number of interlayer boundaries and may thus have disadvantages of high driving voltage and short lifespan.

SUMMARY OF THE INVENTION

Accordingly, the present invention is directed to an organic light emitting device and an organic light emitting display having the same that substantially obviate one or more problems due to limitations and disadvantages of the related art.

An object of the present invention is to provide an organic light emitting device which includes a plurality of light emitting layers in order to improve efficiency and decreases driving voltage in order to increase lifespan.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting device includes a first electrode connected to a thin film transistor formed on a substrate, a second electrode opposite to the first electrode, and an organic laminate formed between the first electrode and the second electrode and including a hole transport layer, a multilayer-light emitting structure, and an electron transport layer.

The multilayer-light emitting structure includes at least two light emitting layers emitting light of different colors through recombination of electrons and holes injected through the first and second electrodes, and a charge transport control layer disposed on boundaries between the at least two light emitting layers. The charge transport control layer is a bipolar material transporting both electrons and holes and controlling an amount of charges transported at the boundaries between the at least two light emitting layers.

An organic light emitting display includes a thin film transistor (TFT) array substrate including gate lines and data lines formed in directions crossing each other so as to define a plurality of pixel areas. An organic light emitting device array formed on the TFT array substrate, where the organic light emitting device array includes organic light emitting devices corresponding to the respective pixel areas. Where each the organic light emitting device includes a first electrode formed at each pixel area, a second electrode opposite to the first electrode; and an organic laminate formed between the first electrode and the second electrode and including a hole transport layer, a multilayer-light emitting structure, and an electron transport layer.

The multilayer-light emitting structure includes at least two light emitting layers emitting light of different colors through recombination of electrons and holes injected through the first and second electrodes and a charge transport control layer disposed on the boundaries between the at least two light emitting layers. Where the charge transport control layer is formed of a bipolar material transporting both electrons and holes and controlling the amount of charges transported at boundaries between the at least two light emitting layers.

Each TFT includes a gate electrode GE formed on the substrate, gate insulating film formed on the substrate and covering the gate electrode, an active layer formed on the gate insulating film and at least partially overlapping the gate electrode GE. A source electrode and a drain electrode formed on the gate insulating layer so as to be separated from each other and contacting both sides of the active layer. Where the first electrode is connected to one of the source electrode and the drain electrode of the TFT.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

DETAILED DESCRIPTION OF THE ILLUSTRATED EMBODIMENTS

Description will now be given in detail of the exemplary embodiments, with reference to the accompanying drawings. For the sake of brief description with reference to the drawings, the same or equivalent components will be provided with the same reference numbers, and description thereof will not be repeated.

Hereinafter, an organic light emitting device and an organic light emitting display having the same in accordance with one embodiment of the present invention will be described with reference to the accompanying drawings.

First, with reference to FIGS. 2 to 5, an organic light emitting display and an organic light emitting device included therein in accordance with one embodiment of the present invention will be described.

Figure 1:
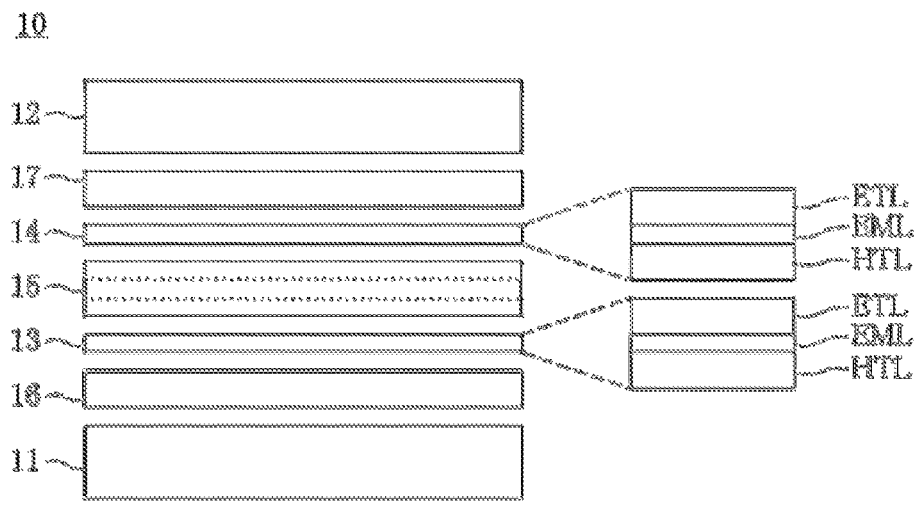
FIG. 1 is a cross-sectional view illustrating a general organic light emitting device having a multi-stack structure.
Figure 2:
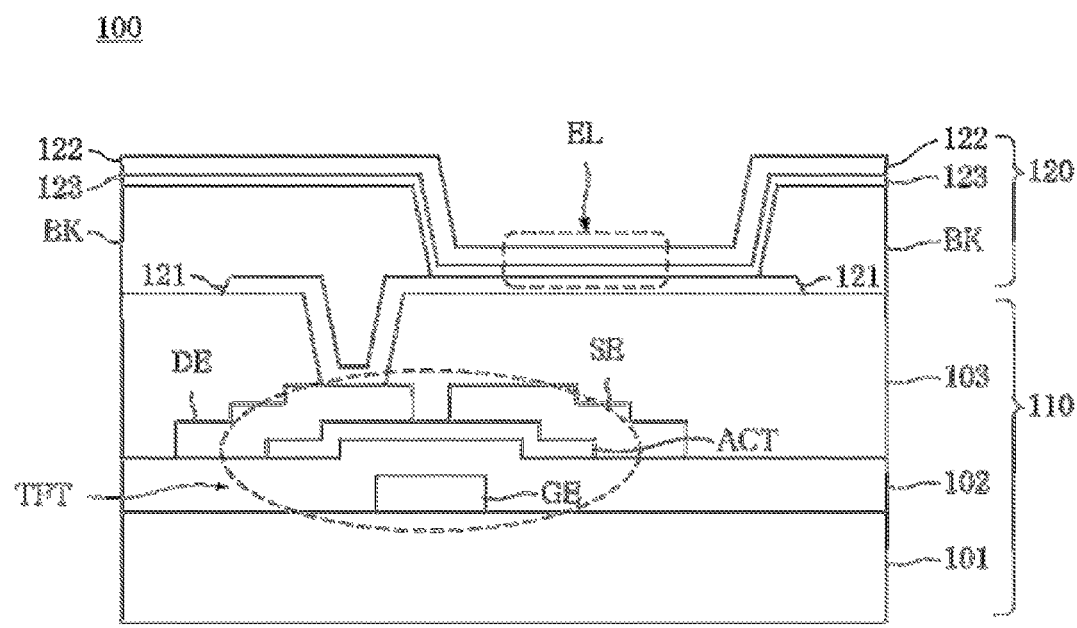
FIG. 2 is a cross-sectional view illustrating a part of an organic light emitting display in accordance with one embodiment of the present invention.
Figure 3:
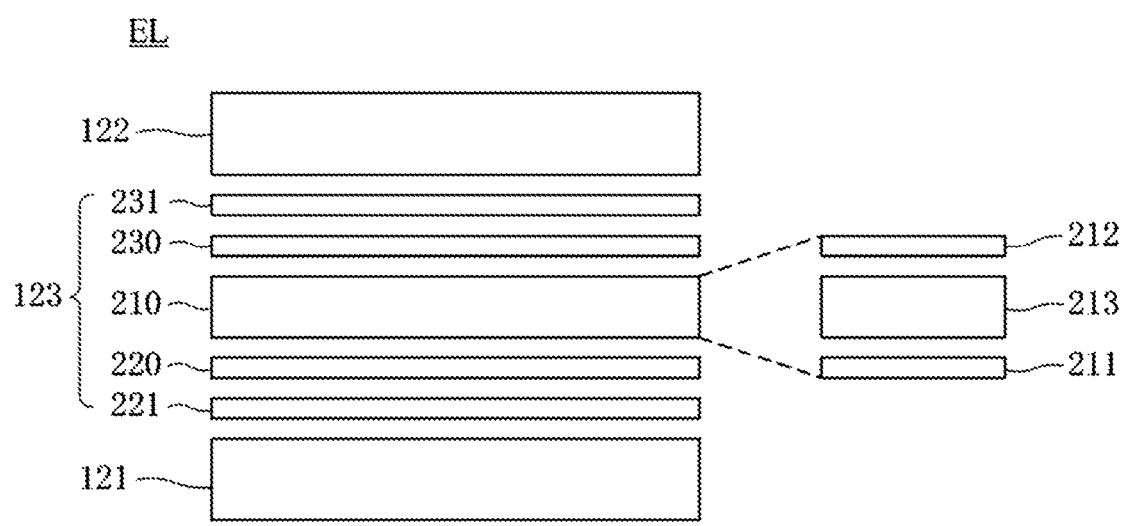
FIG. 3 is a cross-sectional view illustrating an organic light emitting device of FIG. 2.
Figure 4:
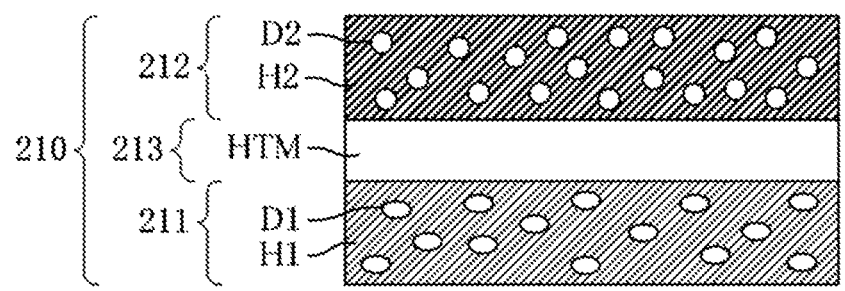
FIG. 4 is a cross-sectional view illustrating a multilayer-light emitting structure shown in FIG. 3 in accordance with one embodiment of the present invention.
Figure 5:
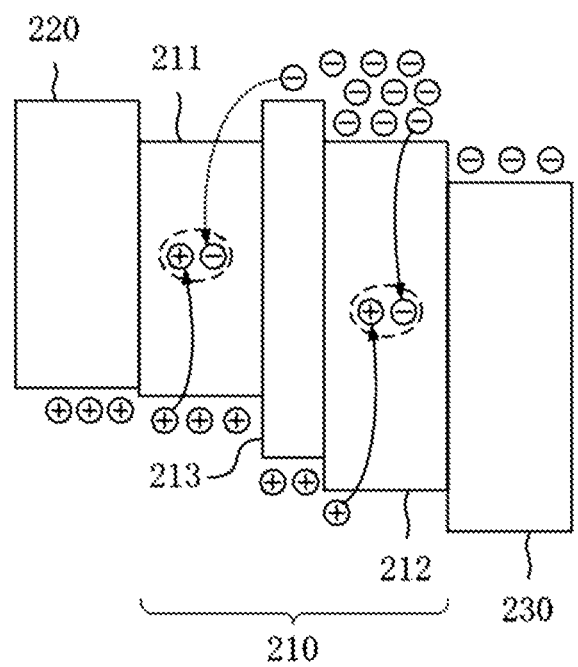
FIG. 5 is a band diagram of an organic laminate in accordance with the embodiment of the present invention.

FIG. 2 is a cross-sectional view illustrating a part of an organic light emitting display in accordance with one embodiment of the present invention, FIG. 3 is a cross-sectional view illustrating an organic light emitting device of FIG. 2, FIG. 4 is a cross-sectional view illustrating a multilayer-light emitting structure shown in FIG. 3 in accordance with one embodiment of the present invention, and FIG. 5 is a band diagram of an organic laminate in accordance with the embodiment of the present invention.

As exemplarily shown in FIG. 2, an organic light emitting display 100 in accordance with one embodiment of the present invention includes a thin film transistor array substrate (hereinafter, "TFT array substrate") 110 and an organic light emitting device array 120 formed on the TFT array substrate.

Although not shown in the drawings, the TFT array substrate 110 includes gate lines (not shown) and data lines (not shown) formed in directions intersecting each other so as to define a plurality of pixel areas and thin film transistors TFT formed at intersecting areas between the gate lines and the data lines and corresponding to the respective pixel areas.

Each thin film transistor TFT includes a gate electrode GE formed on a substrate 101, a gate insulating film 102 formed on the substrate 101 and covering the gate electrode GE, an active layer ACT formed on the gate insulating film 102 and at least partially overlapping the gate electrode GE, and a source electrode SE and a drain electrode DE formed on the gate insulating layer 102 so as to be separated from each other and contacting both sides of the active layer ACT.

The thin film transistor TFT is covered with a protective film 103 formed on the gate insulating layer 102.

The organic light emitting device array 120 includes organic light emitting devices EL corresponding to the respective pixel areas. The organic light emitting device EL includes a first electrode 121 formed at each pixel area on the protective layer 103, a second electrode 122 opposite to the first electrode 121, and an organic laminate 123 formed between the first and second electrodes 121 and 122.

For example, the organic light emitting device array 120 may include first electrodes 121 formed at the respective pixel areas on the protective layer 103, banks BK formed at the outsides of the respective pixel areas on the protective layer 103 and overlapping the edges of the respective first electrodes 121, the organic laminate 123 formed on the first electrodes 121, and the second electrode 122 formed on the whole upper surface of the organic laminate 123.

The first electrode 121 is connected to one of the source electrode SE and the drain electrode DE of the thin film transistor TFT, which is not connected to the data line (not shown).

Further, any one of the first and second electrodes 121 and 122 which is opposite to an image display surface may be formed of a reflective metal material, and the other may be formed of a transparent conductive material.

Otherwise, although not shown in the drawings, both of the first and second electrodes 121 and 122 may be formed of a transparent conductive material and the organic light emitting device array 120 may further include a reflective film which is opposite to the image display surface.

As exemplarily shown in FIG. 3, the organic light emitting device EL includes the first and second electrodes 121 and 122 which are opposite to each other and the organic laminate 123 formed between the first and second electrodes 121 and 122 and includes a multilayer-light emitting structure 210.

If the first electrode 121 is an anode and the second electrode 122 is a cathode, the organic laminate 123 further includes a hole transport layer 220 formed of a hole transport material between the first electrode 121 and the multilayer-light emitting structure 210 and an electron transport layer 230 formed of an electron transport material between the multilayer-light emitting structure 210 and the second electrode 122.

The organic laminate 123 may further includes at least one of a hole injection layer 221 formed of a hole injection material between the first electrode 121 and the hole transport layer 220 and an electron injection layer 231 formed of an electron injection material between the second electrode 122 and the electron transport layer 230.

The multilayer-light emitting structure 210 includes at least two light emitting layers 211 and 212 emitting light using extra energy discharged by the change of excitons, generated through recombination of electrons and holes injected from the first and second electrodes 121 and 122, from an excited state to a ground state and a charge transport control layer 213 formed between the respective light emitting layers 211 and 212.

The at least two light emitting layers 211 and 212 may be formed of materials including different light emitting dopants and thus emit light of different colors.

That is, as exemplarily shown in FIG. 4, if the multilayer-light emitting structure 210 includes first and second light emitting layers 211 and 212, the first light emitting layer 211 is formed of an organic light emitting material including a first light emitting dopant D1 corresponding to a first color and a first host H1 corresponding to the first light emitting dopant D1. Further, the second light emitting layer 212 is formed of an organic light emitting material including a second light emitting dopant D2 corresponding to a second color different from the first color and a second host H2 corresponding to the second light emitting dopant D2.

For example, the first dopant D1 of the first light emitting layer 211 may be a red dopant and the second dopant D2 of the second light emitting layer 212 may be a blue dopant.

In general, a host suitable for a light emitting dopant may be an electron transport material. That is, the first and second hosts H1 and H2 of the first and second light emitting layers 211 and 212 may be electron transport materials.

For example, as electron transport materials selected as the first and second hosts H1 and H2, Liq(8-hydroxyquinolinato-lithium), TPBi(2,2',2''-(1,3,5-benzinetriyl)-tris(1-phenyl-1-H-benzimidazole), PBD(2-(4-biphenyl)-5-(4-tert-butylphenyl)-1,3,4-oxadiazole), BCP(2,9-dimethyl-4,7-diphenyl-1,10-phenanthroline), Bphen(4,7-diphenyl-1,10-phenanthroline), BAlq(Bis(2-methyl-8-quinolinolate)-4-(phenylphenolato)aluminum), Bpy-OXD(1,3-bis[2-(2,2'-bipyridine-6-yl)-1,3,4-oxadiazo-5-yl]benzene), BP-OXD-Bpy(6,6'-bis[5-(biphenyl-4-yl)-1,3,4-oxadiazo-2-yl]-2,2'-bipyridyl), TAZ(3-(4-biphenyl)-4-phenyl-5-tert-butylphenyl-1,2,4-triazole), NTAZ(4-(naphthalen-1-yl)-3,5-diphenyl-4H-1,2,4-triazole), NBphen(2,9-bis(naphthalen-2-yl)-4,7-diphenyl-1,10-phenanthroline), Bpy-FOXD(2,7-bis[2-(2,2'-bipyridine-6-yl)-1,3,4-oxadiazo-5-yl]-9,9-dimethylfluorene), OXD-7(1,3-bis[2-(4-tert-butylphenyl)-1,3,4-oxadiazo-5-yl]benzene), 3TPYMB(Tris(2,4,6-trimethyl-3-(pyridin-3-yl)phenyl)borane), 2-NPIP(1-methyl-2-(4-(naphthalen-2-yl)phenyl)-1H-imidazo[4,5f][1,10][phenanthroline], HNBphen(2-(naphthalen-2-yl)-4,7-diphenyl-1,10-phenanthroline), POPy$_2$(Phenyl-dipyrenylphosphine oxide), BP4mPy(3,3',5,5'-tetra[(m-pyridyl)-phen-3-yl]biphenyl), TmPyPB(1,3,5-tri[3-pyridyl)-phen-3-yl]benzene), BTB(4,4'-bis(4,6-diphenyl-1,3,5-triazin-2-yl)biphenyl), BmPyPhB(1,3-bis[3,5-di(pyridin-3-yl)phenyl]benzene), DPPS(Dophenylbis(4-(pyridin-3-yl) phenyl)silane), PY1(3,5-di(pyren-1-yl)pyridine), TpPyPB (1,3,5-tri(p-pyrid-3-yl-phenyl)benzene), TmPPPyTz(2,4,6-tris(3'-(pyridin-3-yl)biphenyl-3-yl)1,3,5-triazine), B3PYMPM(4,6-bis(3,5-di(pyridin-3-yl)phenyl)-2-methyl-pyrimidine), PFNBr(Poly[(9,9-bis(3'-(N,N-dimethyl)-N-ethylammonium-propyl)-2,7-fluorene)-alt-2,7-(9,9-dioctyl-fluorene)]), TPyQB (1,3,5-tris(4-(pyridin-4-yl)quinolin-2-yl)benzene), DPyBPTz(2-(biphenyl-4-yl)-4,6-bis(4'-(pyridin-2-yl)biphenyl-4-yl)-1,3,5-triazine), and PyBPTz(2,4-di(biphenyl-4-yl)-6-(4'-(pyridin-2-yl)biphenyl-4-yl)-1,3,5-triazine) may be used.

The at least two light emitting layers 211 and 212 are formed of organic light emitting materials including the first and second hosts H1 and H2, i.e., electron transport materials, and thus, holes are transported at a lower transport degree than electrons between the at least two light emitting layers 211 and 212.

That is, the first light emitting layer 211 is closest to the first electrodes 121 among the at least two light emitting layers 211 and 212, thus an amount of holes transported to residual light emitting layers except for the first light emitting layer 211, such as the second light emitting layer 212, is remarkably smaller than an amount of holes transported to the first light emitting layer 211. Accordingly, if there is not the charge transport control layer 213 between the first and second light emitting layer 211, efficiency of the second light emitting layer 212 which is distant from the first electrode 121 may be lowered and thus, efficiency of the device is lowered.

Therefore, the multilayer-light emitting structure 210 in accordance with this embodiment of the present invention includes the charge transport control layer 213 formed of a hole transport material (HTM) at the boundaries between the respective light emitting layers 211 and 212 and controlling the amount of charges transported to the respective light emitting layers 211 and 212, particularly, controlling the transport degrees of holes transported to the respective light emitting layers 211 and 212.

For example, as a hole transport material (HTM) selected as the charge transport control layer 213, NPB(N,N'-bis(naphthalen-1-yl)-N,N'-bis(phenyl)-benzidine), β-NPB(N,N'-bis(naphthalen-2-yl)-N,N'-bis(phenyl)-benzidine), TPD (N,N'-bis(3-methylphenyl)-N,N'-bis(phenyl)-benzidine), spiro-TPD(N,N'-bis(3-methylphenyl)-N,N'-bis(phenyl)-2,7-diamino-9,9-spirobifluorene), spiro-NPB(N,N'-bis(naphthalen-1-yl)-N,N'-bis(phenyl)-2,7-diamino-9,9-spirobifluorene), DMFL-TPD(N,N'-bis(3-methylphenyl)-N,N'-bis(phenyl)-2,7-diamino-9,9-dimethyl-fluorene), DMFL-NPD (N,N'-bis(naphthalen-1-yl)-N,N'-bis(phenyl)-2,7-diamino-9,9-dimethyl-fluorene), DPFL-TPD(N,N'-bis(3-methylphenyl)-N,N'-bis(phenyl)-2,7-diamino-9,9-diphenyl-fluorene), DPFL-NPB(N,N'-bis(naphthalen-1-yl)-N,N'-bis (phenyl)-2,7-diamino-9,9-diphenyl-fluorene), α-NPD(N,N'-bis(naphthalen-1-yl)-N,N'-bis(phenyl)-2,2'-dimethylbenzidine), spiro-TAD(2,2',7,7'-tetrakis(N,N-diphenylamino)-9,9-spirobifluorene), NPAPF(9,9-bis[4-(N,N-bis-naphthalen-2-yl-amino)phenyl]-9H-fluorene), NPBAPF(9,9-bis[4-(N-naphthalen-1-yl-N-phenylamino)-phenyl]-9H-fluorene), spiro-2NPB(2,2',7,7'-tetrakis[N-naphthalenyl(phenyl)-amino]-9,9-spirobifluorene), PAPB (N,N'-bis(phenanthren-9-yl)N,N'-bis(phenyl)-benzidine), 2,2'-spiro-DBP(2,2'-bis[N,N-bis(biphenyl-4-yl)amino]-9,9-spirobifluorene), spiro-BPA(2,2'-bis(N,N-di-phenyl-amino)-9,9-spirobifluorene), TAPC(Di-[4-(N,N-ditolyl-amino)-phenyl]cyclohexane), spiro-TTB(2,2',7,7'-tetra(N,N-ditolyl) amino-9,9-spiro-bifluorene), β-TNB(N,N,N',N'-tetra-naphthalen-2-yl-benzidine), HMTPD(N,N,N',N'-tetra-(3-methylphenyl)-3,3'-dimethylbenzidine), α,β-TNB(N,N'-di (naphthalenyl)-N,N'-di(naphthalen-2-yl)-benzidine), α-TNB(N,N,N',N'-tetra-naphthalenyl-benzidine), β-NPP(N,N'-di(naphthalen-2-yl)-N,N'-diphenylbenzene-1,4-diamine), TTP($N^1,N^4$-diphenyl-$N^1,N^4$-dim-tolylbenzene-1,4-diamine), NDDP ($N^2,N^2,N^6,N^6$-tetraphenylnaphthalen-2,6-diamine), TQTPA(Tris(4-(quinolin-8-yl)phenyl)amine), 3DTAPBP(2,2'-bis(3-(N,N-di-p-tolylamino)phenyl)biphenyl), TFB(Poly[9,9-dioctylfluorenyl-2,7-diyl)-co-(4,4'-(N-(4-sec-butylphenyl)diphenylamine)]), Poly-TPD(Poly[N,N'-bis(4-butylphenyl)N,N'-bis(phenyl)-benzidine]), DBTPB ($N^4,N^{4'}$-bis(dibenzo[b,d]thiophen-4-yl)-$N^4,N^{4'}$-diphenylbiphenyl-4,4'-diamine), DOFL-NPB($N^2,N^7$-di(naphthalen-1-yl)-9,9-dioctyl-$N^2,N^7$-diphenyl-9H-fluorene-2,7-diamine), DOFL-TPD(N,N'-bis(3-methylphenyl)-N,N'-bis(phenyl)-9,9-dioctyl-fluorene), VNPB($N^4,N^{4'}$-di(naphthalen-1-yl)-$N^4,N^{4'}$-bis(4-vinylphenyl)biphenyl-4,4'-diamine), ONPB($N^4,N^{4'}$-bis(4-(6-((3-ethyloxetan-3-yl)methoxy)hexyl)phenyl)-$N^4,N^{4'}$-diphenylbiphenyl-4,4'-diamine), OTPD($N^4,N^{4'}$-bis(4-(6-((3-ethyloxetan-3-yl)methoxy)hexyl)phenyl)-$N^4,N^{4'}$-diphenylbiphenyl-4,4'-diamine), and QUPD($N^4,N^{4'}$-bis(4-(6-((3-ethyloxetan-3-yl)methoxy)hexyl)phenyl)-$N^4,N^{4'}$-bis(4-methoxyphenyl)biphenyl-4,4'-diamine) may be used.

As described above, by interposing a single charge transport control layer 213 formed of the hole transport material (HTM) at the boundaries between the at least two light emitting layers 211 and 212, the transport degree of holes between the at least two light emitting layers 211 and 212 may be improved. Therefore, the amount of holes supplied from the first electrode 121 and transported to the second light emitting layer 212 may be increased, lowering of efficiency of the second light emitting layer 212 may be prevented and thus, efficiency of the device may be improved.

Further, because the charge transport control layer 213 in accordance with this embodiment is formed of the hole transport material (HTM), the transport degree of holes between the light emitting layers 211 and 212 is improved. However the transport degree of electrons between the light emitting layers 211 and 212 may be lowered by the charge transport control layer 213.

That is, as exemplarily shown in FIG. 5, the charge transport control layer 213 is formed of the hole transport material (HTM) having a transport degree of electrons remarkably lower than a transport degree of holes. Therefore, electrons are not transported and thus accumulated at the boundary between the charge transport control layer 213 and the second light emitting layer 211. That is, because charge transport from the second light emitting layer 211 to the charge transport control layer 213 is not easy, the transport degree of electrons to the first light emitting layer 211 is lowered and efficiency of the first light emitting layer 211 is lowered.

Furthermore, charges accumulated at the boundary may cause device deterioration and thus, lifespan of the device may be reduced.

Therefore, a charge transport control layer of an organic light emitting device EL in accordance with another embodiment of the present invention is formed of a bipolar material having similar transport degrees of holes and charges.

Figure 6:
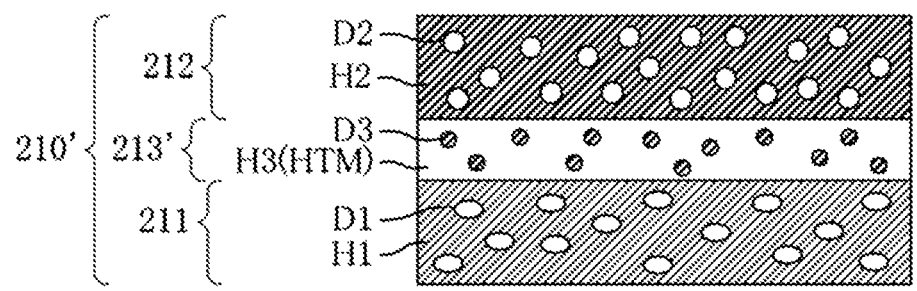
FIG. 6 is a cross-sectional view illustrating a multilayer-light emitting structure shown in FIG. 3 in accordance with another embodiment of the present invention.
Figure 7:
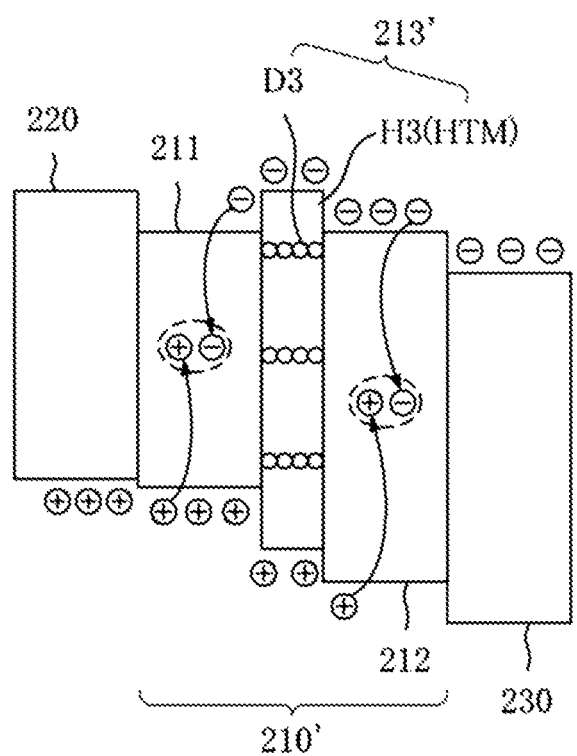
FIG. 7 is a band diagram of an organic laminate in accordance with the second embodiment of the present invention.

FIG. 6 is a cross-sectional view illustrating a multilayer-light emitting structure shown in FIG. 3 in accordance with another embodiment of the present invention, and FIG. 7 is a band diagram of an organic laminate in accordance with the embodiment of the present invention.

As exemplarily shown in FIG. 6, the organic light emitting device EL in accordance with this embodiment of the present invention is the same as the organic light emitting device EL in accordance with the former embodiment of the present invention shown in FIGS. 2 to 5 except that a charge transport control layer 213' of a multilayer-light emitting structure 210' is not formed of a hole transport material (HTM) alone but is formed of a mixture having bipolarity, acquired by mixing a third host H3 which is a hole transport material (HTM) with a third dopant D3 which is an electron transport material, and a detailed description of a part of the construction and operation of this embodiment are substantially the same as those of the former embodiment shown in FIGS. 2 to 5 as such, the detailed description will be omitted.

The charge transport control layer 213' in accordance with this embodiment of the present invention is formed of the mixture acquired by mixing the third host H3 which is a hole transport material (HTM) and the third dopant D3 which is an electron transport material. That is, the charge transport control layer 213' has bipolarity in which the transport degrees of holes and charges are similar.

In more detail, the charge transport control layer 213 in accordance with the embodiment shown in FIGS. 2 to 5 is formed of a hole transport material (HTM) alone. On the contrary, the charge transport control layer 213' in accordance with the embodiment shown in FIGS. 6 and 7 is formed of a mixture acquired by mixing a third host H3 which is a hole transport material (HTM) with a third dopant D3 which is an electron transport material.

Here, the content of the third dopant D3 added to the third host H3 which is a hole transport material (HTM) may be greater than 0% and less than 50%, so that the transport degree of holes by the charge transport control layer 213' is not lower than the transport degree of electrons by the charge transport control layer 213'.

Any electron transport material may be selected as the third dopant D3.

Particularly, the third dopant D3 may be the same material with the host of at least one of the first and second light emitting layers 211 and 212, i.e., the first and second hosts H1 and H2 (with reference to FIG. 4). Thereby, the number of materials added to form the charge transport control layer 213' having bipolarity may be reduced and thus, a manufacturing process may be simplified and manufacturing costs may be reduced.

For example, as an electron transport material selected as the third dopant D3 of the charge transport control layer 213', in the same manner as the first and second hosts H1 and H2, Liq(8-hydroxyquinolinolato-lithium), TPBi(2,2',2"-(1,3,5-benzinetriyl)-tris(1-phenyl-1-H-benzimidazole), PBD (2-(4-biphenyl)-5-(4-tert-butylphenyl)-1,3,4-oxadiazole), BCP(2,9-dimethyl-4,7-diphenyl-1,10-phenanthroline), Bphen(4,7-diphenyl-1,10-phenanthroline), BAlq(Bis(2-methyl-8-quinolinolate)-4-(phenylphenolato)aluminum), Bpy-OXD(1,3-bis[2-(2,2'-bipyridine-6-yl)-1,3,4-oxadiazo-5-yl]benzene), BP-OXD-Bpy(6,6'-bis[5-(biphenyl-4-yl)-1,3,4-oxadiazo-2-yl]-2,2'-bipyridyl), TAZ(3-(4-biphenyl)-4-phenyl-5-tert-butylphenyl-1,2,4-triazole), NTAZ(4-(naphthalen-1-yl)-3,5-diphenyl-4H-1,2,4-triazole), NBphen (2,9-bis(naphthalen-2-yl)-4,7-diphenyl-1,10-phenanthroline), Bpy-FOXD(2,7-bis[2-(2,2'-bipyridine-6-yl)-1,3,4-oxadiazo-5-yl]-9,9-dimethylfluorene), OXD-7(1,3-bis[2-(4-tert-butylphenyl)-1,3,4-oxadiazo-5-yl]benzene), 3TPYMB(Tris(2,4,6-trimethyl-3-(pyridin-3-yl)phenyl)borane), 2-NPIP(1-methyl-2-(4-(naphthalen-2-yl)phenyl)-1H-imidazo[4,5f][1,10][phenanthroline], HNBphen(2-(naphthalen-2-yl)-4,7-diphenyl-1,10-phenanthroline), $POPy_2$ (Phenyl-dipyrenylphosphine oxide), BP4mPy (3,3',5,5'-tetra[(m-pyridyl)-phen-3-yl]biphenyl), TmPyPB(1,3,5-tri[3-pyridyl)-phen-3-yl]benzene), BTB(4,4'-bis(4,6-diphenyl-1, 3,5-triazin-2-yl)biphenyl), BmPyPhB(1,3-bis[3,5-di (pyridin-3-yl)phenyl]benzene), DPPS(Dophenylbis(4-(pyridin-3-yl)phenyl)silane), PY1(3,5-di(pyren-1-yl) pyridine), TpPyPB(1,3,5-tri(p-pyrid-3-yl-phenyl)benzene), TmPPPyTz(2,4,6-tris(3'-(pyridin-3-yl)biphenyl-3-yl)1,3,5-triazine), B3PYMPM(4,6-bis(3,5-di(pyridin-3-yl)phenyl)-2-methylpyrimidine), PFNBr(Poly[(9,9-bis(3'-(N,N-dimethyl)-N-ethylammonium-propyl)-2,7-fluorene)-alt-2,7-(9, 9-dioctylfluorene)]), TPyQB(1,3,5-tris(4-(pyridin-4-yl) quinolin-2-yl)benzene), DPyBPTz(2-(biphenyl-4-yl)-4,6-bis(4'-(pyridin-2-yl)biphenyl-4-yl)-1,3,5-triazine), and PyBPTz(2,4-di(biphenyl-4-yl)-6-(4'-(pyridin-2-yl)biphenyl-4-yl)-1,3,5-triazine) may be used.

As described above, the charge transport control layer 213' includes the third host H3 which is a hole transport material (HTM) and thus improves the transport degree of holes between the at least two light emitting layers 211 and 212, and further includes the third dopant D3 which is an electron transport material and thus prevents lowering of the transport degree of electrons between the at least two light emitting layers 211 and 212.

As exemplarily shown in FIG. 7, if the charge transport control layer 213' on the boundaries between the at least two light emitting layers 211 and 212 is formed of the mixture including the third host H3 which is a hole transport material (HTM) and the third dopant D3 which is an electron transport material, transport of holes between the at least two light emitting layers 211 and 212 may be facilitated by the third host H3 which is the hole transport material (HTM). Also transport of electrons between the at least two light emitting layers 211 and 212 may not be hindered by the third dopant D3 which is the electron transport material.

Because electrons may be easily transported at the boundary between the charge transport control layer 213' and the second light emitting layer 212 as such, the transport degree of electrons to the first light emitting layer 211 may be improved, as compared to the former embodiment shown in FIGS. 2 to 5, and thus, efficiency of the first light emitting layer 211 may be improved and efficiency of the device may be improved, as compared to the former embodiment shown in FIGS. 2 to 5.

Table 1 below illustrates the comparison between characteristics of the organic light emitting device in accordance with the embodiment shown in FIGS. 2 to 5 and the organic light emitting device in accordance with the embodiment shown in FIGS. 6 and 7.

TABLE 1

|  | Driving voltage (V) | cd/A | EQE (efficiency) |
|---|---|---|---|
| Embodiment 1 | 1.00 | 1.00 | 1.00 |
| Embodiment 2 | 0.96 | 1.96 | 1.50 |

As illustrated in Table 1, it may be understood that the organic light emitting device in accordance with the embodiment shown in FIGS. 6 and 7 may be driven at driving voltage reduced by 0.04V and exhibit brightness increased by 0.96 cd/A and efficiency increased by 0.50, as compared to the organic light emitting device in accordance with the embodiment shown in FIGS. 2 to 5.

As described above, the organic light emitting devices (ELs) in accordance with the respective embodiments of the present invention include the at least two light emitting layers 211 and 212 emitting light of different colors and may thus improve efficiency and efficiently produce white light.

A general organic light emitting device having a multi-stack structure includes electron transport layers, hole transport layers, and separate charge generation layers generating charges between light emitting layers of each stack and thus, is difficult to reduce the number of interlayer boundaries and has high driving voltage and thereby shortens lifespan. On the other hand, the organic light emitting devices in accordance with the embodiments of the present invention include either the single charge transport control layer 213 or the single charge transport control layer 213' which is formed of a material including a hole transport material (HTM) at the boundaries between the at least two light emitting layers 211 and 212.

Thereby, the organic light emitting devices in the embodiments of the present invention may reduce the number of interlayer boundaries, as compared to the general organic light emitting device having a multi-stack structure, and thus lower driving voltage. That is, the organic light emitting devices in the embodiments of the present invention may be driven at a low voltage and thus, the lifespan of the organic light emitting devices may be improved.

Further, even though at least two light emitting layers 211 and 212 include hosts of electron transport materials, because one of the charge transport control layer 213' is formed of a pure material or a mixture including a hole transport material (HTM) between the first and second light emitting layers 211, 212, the transport degree of holes injected from the first electrode 121 may be improved. Therefore, efficiency of the second light emitting layer 212 which is most distant from the first electrode 121 may be improved.

Particularly, in accordance with the embodiment shown in FIGS. 6 and 7, the charge transport control layer 213' is formed of a mixture acquired by mixing the third host H3 which is a hole transport material (HTM) with the third dopant D3 which is an electron transport material and thus, has bipolarity.

Therefore, accumulation of electrons at the boundary between the charge transport control layer 213' and the second light emitting layer 212 is prevented by the third dopant D3 of the charge transport control layer 213' and the Transport Degree of electrons to the first light emitting layer 211 which is most distant from the second electrode 122 may be improved. Thus, lowering of efficiency of the first light emitting layer 211 may be prevented and efficiency of the device may be improved.

Further, accumulation of electrons at the boundary between the charge transport control layer 213' and the second light emitting layer 212 is prevented and thus, deterioration of the device may be prevented.

As apparent from the above description, an organic light emitting device in accordance with one embodiment of the present invention includes a multilayer-light emitting structure formed between a hole transport layer and an electron transport layer, and the multilayer-light emitting structure include at least two light emitting layers emitting light of different colors and a charge transport control layer formed of a bipolar material between the at least two light emitting layers and controlling an amount of charges transported between the at least two light emitting layers.

That is, the charge transport control layer interposed between the at least two light emitting layers is formed of a mixture including a host which is a hole transport material and a dopant which is an electron transport material and thus, has bipolarity capable of transporting both electrons and holes.

Because the organic light emitting device includes at least two light emitting layers and further includes the charge transport control layer, electrons and holes supplied from first and second electrodes may be uniformly transported to the at least two light emitting layers.

Therefore, the organic light emitting device includes at least two light emitting layers and may thus improve efficiency, reduce the number of interlayer boundaries, as compared to a multi-stack structure, and thus lower driving voltage, thereby increasing lifespan.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting device comprising:
   a first electrode connected to a thin film transistor formed on a substrate;
   a second electrode opposite to the first electrode; and
   an organic laminate formed between the first electrode and the second electrode and including a hole transport layer, a multilayer-light emitting structure, and an electron transport layer,
   wherein the multilayer-light emitting structure includes:
   at least two light emitting layers emitting light of different colors through recombination of electrons and holes injected through the first and second electrodes, wherein each of the at least two light emitting layers is a single layer formed of a mixture including a dopant corresponding to each of the different colors and a host of an electron transport material; and
   a charge transport control layer disposed on boundaries between the at least two light emitting layers,
   wherein the hole transport layer is in direct contact with a first light emitting layer of the at least two light emitting layers at a lowest of the multilayer-light emitting structure and the electron transport layer is in direct contact with a second light emitting layer of the at least two light emitting layers at a highest of the multilayer-light emitting structure,
   wherein the charge transport control layer is formed of a mixture including a main component composed of a hole transport material and a sub component composed of an electron transport material,
   wherein the host of at least one of the at least two light emitting layers is the same as the sub component of the charge transport control layer, and wherein the charge transport control layer has a bipolar property transporting both electrons and holes and controlling an amount of charges transported such that the charges do not accumulate at the boundaries between the at least two light emitting layers.

2. The organic light emitting device according to claim 1, wherein, among the at least two light emitting layers, the first light emitting layer includes a red dopant and the second light emitting layer includes a blue dopant.

3. The organic light emitting device according to claim 1, wherein the organic laminate further includes at least one of:
   a hole injection layer disposed between the first electrode and the hole transport layer and formed of a hole injection material; and
   an electron injection layer disposed between the second electrode and the electron transport layer and formed of an electron injection material.

4. The organic light emitting device according to claim 1, wherein the material of the sub component of the charge transfer control layer is selected from one of Liq(8-hydroxyquinolinolato-lithium), TPBi(2,2',2''-(1,3,5-benzinetriyl)-tris(1-phenyl-1-H-benzimidazole), PBD(2-(4-biphenyl)-5-(4-tert-butylphenyl)-1,3,4-oxadiazole), BCP(2,9-dimethyl-4,7-diphenyl-1,10-phenanthroline), Bphen(4,7-diphenyl-1,10-phenanthroline), BAlq(Bis(2-methyl-8-quinolinolate)-4-(phenylphenolato)aluminum), Bpy-OXD(1,3-bis[2-(2,2'-bipyridine-6-yl)-1,3,4-oxadiazo-5-yl]benzene), BP-OXD-Bpy(6,6'-bis[5-(biphenyl-4-yl)-1,3,4-oxadiazo-2-yl]-2,2'-bipyridyl), TAZ(3-(4-biphenyl)-4-phenyl-5-tert-butylphenyl-1,2,4-triazole), NTAZ(4-(naphthalen-1-yl)-3,5-diphenyl-4H-1,2,4-triazole), NBphen(2,9-bis(naphthalen-2-yl)-4,7-diphenyl-1,10-phenanthroline), Bpy-FOXD(2,7-bis[2-(2,2'-bipyridine-6-yl)-1,3,4-oxadiazo-5-yl]-9,9-dimethylfluorene), OXD-7 (1,3-bis[2-(4-tert-butylphenyl)-1,3,4-oxadiazo-5-yl]benzene), 3TPYMB(Tris(2,4,6-trimethyl-3-(pyridin-3-yl)phenyl)borane), 2-NPIP(1-methyl-2-(4-(naphthalen-2-yl)phenyl)-1H-imidazo[4,5f][1,10][phenanthroline], HNBphen(2(naphthalen-2-yl)-4,7-diphenyl-1,10-phenanthroline), POPy2(Phenyl-dipyrenylphosphine oxide), BP4mPy(3,3',5,5'-tetra[(m-pyridyl)-phen-3-yl]biphenyl), TmPyPB(1,3,5-tri[3-pyridyl)-phen-3-yl]benzene), BTB (4,4'-bis(4,6-diphenyl-1,3,5-triazin-2-yl)biphenyl), BmPyPhB(1,3-bis[3,5-di(pyridin-3-yl)phenyl]benzene), DPPS(Dophenylbis(4-(pyridin-3-yl)phenyl)silane), PY1(3,5-di(pyren-1-yl)pyridine), TpPyPB (1,3,5-tri(p-pyrid-3-yl-phenyl)benzene), TmPPPyTz(2,4,6tris(3'-(pyridin-3-yl)biphenyl-3-yl)1,3,5-triazine), B3PYMPM(4,6-bis(3,5-di(pyridin-3-yl)phenyl)-2-methyl-pyrimidine), PFNBr(Poly[(9,9-bis(3'-(N,N-dimethyl)-N-ethylammonium-propyl)-2,7-fluorene)-alt-2,7-(9,9-dioctyl-fluorene)]), TPyQB(1,3,5-tris(4-(pyridin-4-yl)quinolin-2-yl)benzene), DPyBPTz(2-(biphenyl-4-yl)-4,6-bis(4'-(pyridin-2-yl)biphenyl-4-yl)-1,3,5-triazine), and PyBPTz(2,4-di(biphenyl-4-yl)-6-(4'-(pyridin-2-yl)biphenyl-4-yl)-1,3,5-triazine).

5. An organic light emitting display comprising:
   a thin film transistor (TFT) array substrate including gate lines and data lines formed in directions intersecting each other so as to define a plurality of pixel areas;
   an organic light emitting device array formed on the TFT array substrate, wherein the organic light emitting device array includes organic light emitting devices corresponding to the respective pixel areas,
   wherein each organic light emitting device includes:
   a first electrode formed at each pixel area;
   a second electrode opposite to the first electrode; and
   an organic laminate formed between the first electrode and the second electrode and including a hole transport layer, a multilayer-light emitting structure, and an electron transport layer,
   wherein the multilayer-light emitting structure includes:
   at least two light emitting layers emitting light of different colors through recombination of electrons and holes injected through the first and second electrodes, wherein each of the at least two light emitting layers is a single layer formed of a mixture including a dopant corresponding to each of the different colors and a host of an electron transport material; and
   a charge transport control layer disposed on the boundaries between the at least two light emitting layers,
   wherein the hole transport layer is in direct contact with a first light emitting layer of the at least two light emitting layers at a lowest of the multilayer-light emitting structure and the electron transport layer is in direct contact with a second light emitting layer of the at least two light emitting layers at a highest of the multilayer-light emitting structure, each TFT includes a gate electrode formed on the substrate, a gate insulating film formed on the substrate and covering the gate electrode, an active layer formed on the gate insulating film and at least partially overlapping the gate electrode, and a source electrode and a drain electrode formed on the gate insulating layer so as to be separated from each other and contacting both sides of the active layer, wherein, the first electrode is connected to one of the source electrode and the drain electrode of the TFT, wherein the charge transport control layer is formed of a mixture including a main component composed of a hole transport material and a sub component composed of an electron transport material, wherein the host of at least one of the at least two light emitting layers is the same as the sub component of the charge transport control layer, and wherein the charge transport control layer has a bipolar property transporting both electrons and holes and controlling an amount of charges transported such that the charges do not accumulate at the boundaries between the at least two light emitting layers.

6. The organic light emitting device according to claim 5, wherein, among the at least two light emitting layers, the first light emitting layer includes a red dopant and the second light emitting layer includes a blue dopant.

7. The organic light emitting device according to claim 5, wherein the organic laminate further includes at least one of:
a hole injection layer disposed between the first electrode and the hole transport layer and formed of a hole injection material; and
an electron injection layer disposed between the second electrode and the electron transport layer and formed of an electron injection material.

8. The organic light emitting device according to claim 5, wherein the material of the sub component of the charge transfer control layer includes is selected from one of Liq(8-hydroxyquinolinolato-lithium), TPBi(2,2',2"-(1,3,5-benzinetriyl)-tris(1-phenyl-1-H-benzimidazole), PBD(2-(4-biphenyl)-5-(4-tert-butylphenyl)-1,3,4-oxadiazole), BCP(2, 9-dimethyl-4,7-diphenyl-1,10-phenanthroline), Bphen(4,7-diphenyl-1,10-phenanthroline), BAlq(Bis(2-methyl-8-quinolinolate)-4-(phenylphenolato)aluminum), Bpy-OXD (1,3-bis[2-(2,2'-bipyridine-6-yl)-1,3,4-oxadiazo-5-yl] benzene), BP-OXD-Bpy(6,6'-bis[5-(biphenyl-4-yl)-1,3,4-oxadiazo-2-yl]-2,2'-bipyridyl), TAZ(3-(4-biphenyl)-4-phenyl-5-tert-butylphenyl-1,2,4-triazole), NTAZ(4-(naphthalen-1-yl)-3,5-diphenyl4H-1,2,4-triazole), NBphen (2,9-bis(naphthalen-2-yl)-4,7-diphenyl-1,10-phenanthroline), Bpy-FOXD(2,7-bis[2-(2,2'-bipyridine-6-yl)-1,3,4-oxadiazo-5-yl]-9,9-dimethylfluorene), OXD-7(1, 3-bis[2-(4-tert-butylphenyl)-1,3,4-oxadiazo-5-yl]benzene), 3TPYMB(Tris(2,4,6-trimethyl-3-(pyridin-3-yl)phenyl)borane), 2-NPIP(1-methyl-2-(4-(naphthalen-2-yl)phenyl)-1H-imidazo[4,5f][1,10][phenanthroline], HNBphen(2-(naphthalene-2-yl)-4,7-diphenyl-1,10-phenanthroline), POPy2 (Phenyl-dipyrenylphosphine oxide), BP4mPy(3,3',5,5'-tetra [(m-pyridyl)-phen-3-yl]biphenyl), TmPyPB(1,3,5-tri[3-pyridyl)-phen-3-yl]benzene), BTB(4,4'-bis(4,6-diphenyl-1, 3,5-triazin-2-yl)biphenyl), BmPyPhB(1,3-bis[3,5-di (pyridin-3-yl)phenyl]benzene), DPPS(Dophenylbis(4-(pyridin-3-yl)phenyl)silane), PY1(3,5-di(pyren-1-yl) pyridine), TpPyPB(1,3,5-tri(p-pyrid-3-yl-phenyl)benzene), TmPPPyTz(2,4,6-tris(3'-(pyridin-3-yl)biphenyl-3-yl)1,3,5-triazine), B3PYMPM(4,6-bis(3,5-di(pyridin-3-yl)phenyl)-2-methylpyrimidine), PFNBr(Poly[(9,9-bis(3'-(N,N-dimethyl)-N-ethylammonium-propyl)-2,7-fluorene)-alt-2,7-(9, 9-dioctylfluorene)]), TPyQB(1,3,5-tris(4-(pyridin-4-yl) quinolin-2-yl)benzene), DPyBPTz(2-(biphenyl-4-yl)-4,6-bis(4'-(pyridin-2-yl)biphenyl-4-yl)-1,3,5-triazine), and PyBPTz(2,4-di(biphenyl-4-yl)-6-(4'-(pyridin-2-yl)biphenyl-4-yl)-1,3,5-triazine).

* * * * *